(12) United States Patent
Yamazaki et al.

(10) Patent No.: US 6,756,670 B1
(45) Date of Patent: Jun. 29, 2004

(54) ELECTRONIC DEVICE AND ITS MANUFACTURING METHOD

(75) Inventors: Shunpei Yamazaki, Tokyo (JP);
Mitsunori Tsuchiya, Atsugi (JP);
Kazuo Urata, Ichikawa (JP); Itaru Koyama, Hatano (JP); Shinji Imatou, Atsugi (JP); Shigenori Hayashi, Atsugi (JP); Naoki Hirose, Shimonoseki (JP);
Mari Sasaki, Atsugi (JP); Noriya Ishida, Asahikawa (JP); Kouhei Wada, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/698,055

(22) Filed: Oct. 30, 2000

Related U.S. Application Data (60) Division of application No. 08/161,859, filed on Dec. 6, 1993, now Pat. No. 6,191,492, which is a continuation of application No. 07/965,690, filed on Oct. 22, 1992, now abandoned, which is a continuation of application No. 07/658,634, filed on Feb. 22, 1991, now abandoned, which is a continuation-in-part of application No. 07/397,866, filed on Aug. 24, 1989, now abandoned.

(30) Foreign Application Priority Data

| Aug. 26, 1988 | (JP) | 63-212885 |
| Oct. 17, 1988 | (JP) | 63-261961 |
| Oct. 17, 1988 | (JP) | 63-261962 |

(51) Int. Cl.[7] .............................. H01L 23/06
(52) U.S. Cl. .................. 257/729; 257/787; 257/795; 257/790; 257/77
(58) Field of Search .................. 257/729, 635, 257/631, 77, 678, 787, 795, 790; 148/33.3; 428/408; 427/526; 357/72

(56) References Cited

U.S. PATENT DOCUMENTS

| 4,017,340 A | * | 4/1977 | Yerman ............ 148/33.3 |
| 4,040,874 A | * | 8/1977 | Yerman ............ 148/33.3 |
| 4,198,444 A | * | 4/1980 | Yerman ............ 438/763 |
| 4,315,808 A | | 2/1982 | Imada et al. ........ 264/83 |

(List continued on next page.)

FOREIGN PATENT DOCUMENTS

| JP | 54-47575 | 4/1979 |
| JP | 56-049530 | 5/1981 |
| JP | 57-053968 | 3/1982 |
| JP | 58-199543 | 11/1983 |
| JP | 61-67247 | 4/1986 |

(List continued on next page.)

OTHER PUBLICATIONS

Graf. G., "Diamonds find new settings," Apr. 1987, High Technology 44–47.*

(List continued on next page.)

*Primary Examiner*—Tom Thomas
*Assistant Examiner*—Douglas W. Owens
(74) *Attorney, Agent, or Firm*—Eric J. Robinson; Robinson Intellectual Property Law Office, P.C.

(57) ABSTRACT

An electronic device comprising a substrate having a frame, a metal lead and an electronic parts in a bonding structure, and a molding of an organic resin formed on the substrate, wherein the surface of the organic resin is provided with a hardened water-resistant or carbonaceous film or wherein pores at the surface of the organic resin are filled within an inactive gas such as argon because of a plasma treatment of the resin surface with the inactive gas whereby impurities are prevented from entering into the organic resin through the pores.

30 Claims, 6 Drawing Sheets

U.S. PATENT DOCUMENTS

| | | | |
|---|---|---|---|
| 4,434,188 A | 2/1984 | Karrio et al. | 423/446 |
| 4,681,718 A | 7/1987 | Oldham | 264/102 |
| 4,717,806 A | 1/1988 | Battey et al. | |
| 4,735,832 A | 4/1988 | Ichikawa et al. | 427/2 |
| 4,753,855 A | 6/1988 | Haluka et al. | |
| 4,869,755 A | 9/1989 | Huschka et al. | 437/215 |
| 4,869,923 A * | 9/1989 | Yamazaki | 427/571 |
| 4,902,529 A | 2/1990 | Rebhan et al. | 427/37 |
| 4,907,061 A * | 3/1990 | Kohara | 257/679 |
| 4,908,685 A * | 3/1990 | Shibasaki et al. | 257/425 |
| 4,935,665 A * | 6/1990 | Murata | 313/500 |
| 4,972,250 A | 11/1990 | Omori et al. | 357/57 |
| 4,974,057 A | 11/1990 | Tazima | 357/74 |
| 4,987,007 A * | 1/1991 | Wagal et al. | 427/526 |
| 5,087,959 A * | 2/1992 | Omori et al. | 257/635 |
| 5,147,822 A | 9/1992 | Yamazaki et al. | |
| 5,276,351 A * | 1/1994 | Yamazaki et al. | 257/666 |
| 6,191,492 B1 * | 2/2001 | Yamazaki et al. | 257/787 |
| 6,224,952 B1 | 5/2001 | Itoh | |
| 2001/0018097 A1 | 8/2001 | Itoh | |

FOREIGN PATENT DOCUMENTS

| | | |
|---|---|---|
| JP | 61-121348 | 6/1986 |
| JP | 62-002557 | 1/1987 |
| JP | 62-155542 | 7/1987 |
| JP | 63-15448 | 1/1988 |
| JP | 63-170930 | 7/1988 |
| JP | 63-314856 | 12/1988 |
| JP | 01-244624 | 9/1989 |
| JP | 2-106952 | 4/1990 |
| JP | 2-106954 | 4/1990 |
| JP | 02-119134 | 5/1990 |
| JP | 02-183531 | 7/1990 |

OTHER PUBLICATIONS

Robinson, A., "Is Diamond the new wonder material," Nov. 28, 1986, Science, vol. 234, 1074–76.*

Specification, claims, abstract and drawings of U.S. patent application Ser. No. 09/837,335 entitled Electrostatic–Erasing Abrasion–Proof Coating and Method for Forming the Same, filed Apr. 19, 2001.

Wolf, et al., "Silicon Processing for the VLSI Era" vol. 1, Processing Technology Lettice Press, Sunset Beach Ca. 1986, pp 171–172, 191–194.

"Modern Microelectronic Circuit Design", pp. 674–681, IC Applications, Fabrication Technology, vol. II, Research and Education Assoc., NY, NY.

* cited by examiner

ELECTRONIC DEVICE AND ITS MANUFACTURING METHOD

REFERENCE TO RELATED APPLICATION

This application is a Divisional of application Ser. No. 08/161,859 filed Dec. 6, 1993 now U.S. Pat. No. 6,191,492, which is a Continuation of Ser. No. 07/965,690 filed Oct. 22, 1992 now abandoned, which is a Continuation of Ser. No. 07/658,634 filed Feb. 22, 1991 now abandoned, which itself is a Continuation-in-Part of Ser. No. 07/397,866 filed Aug. 24, 1989, now abandoned.

BACKGROUND OF THE INVENTION

1. Field of the Invention

The present invention relates to an electronic device such as a semiconductor device or the like and a method for manufacturing such an electronic device, specifically to an electronic device and a manufacturing method therefor in which a molding is provided with a protection layer applied over the entire body of the electronic device.

2. Description of the Prior Art

Conventionally, an electronic device such as a semiconductor device or the like is wirebonded and a molding material is applied over the entire body of the electronic device.

Generally, in a plastic molding package, water which reduces the reliability of the electronic device enters the molding from external sources, and has a tendency to collect on the rear or under side of the die of the lead frame. Then this moisture vaporizes quickly when the package is soldered (this generally involves immersion in molten solder at 260° C. for 3 to sec). As a result, the molding which is softened by this heating swells, so that cracks or bulging are induced in the molding itself.

Figure 1:
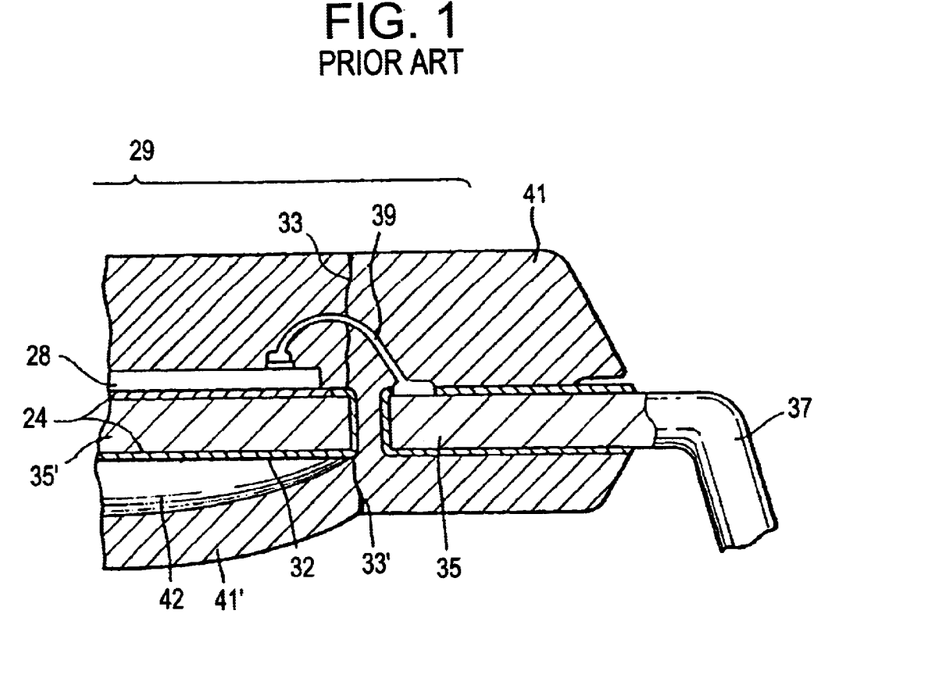
FIG. 1 is a vertical cross sectional view showing the essential elements after a moisture resistance test and solder test have been performed on the plastic package of the prior art device.

A conventional semiconductor device as shown in FIG. 1 comprises a lead 35 and a die 35', an IC chip 28 die-attached to the die 35' and a molding 41.

The frame die 35' is made of metal such as copper, "42 Alloy" or the like, on the surfaces, specifically on the under or reverse side, of which a low class oxide 32 is inclined to be formed during heat treatment at 100° C. to 350° C. when the electronic part 28 is die-attached to the die 35' through a paste layer 24.

For this reason, if the molding process is performed using an organic resin to form a molding 41 immediately after the die-attaching, an extremely easily-peeled oxide layer 32 remains between the molding 41 and the copper or "42 Alloy". When this electronic device is stored for a long period, the moisture from the air is absorbed by the molding 41 and the moisture is accumulated in the vicinity of the oxide layer 32. For this reason, the electronic device is unable to withstand the sudden thermal shock that occurs when solder is subsequently applied for 3 to 10 sec at 260° C., and cracks 33, 33' are produced in the molding 41 around the periphery of the die 35'. In addition, the moisture collected on the rear side of the die 35' is converted to steam and a void 42 occurs at that point, so that swelling 41' (the phenomenon of swelling occurs because the water in the vicinity of the die 35' turns to gas as a result of the temperature elevation when solder is applied to the molding 41 on the rear side of the die 35') occurs on the under or rear side of the molding 41. Then, for a long time use after it is mounted on a printed-circuit board (PCB), the entry of water and impurities at the location of the cracks induces a deterioration in the characteristics and reliability of the semiconductor device.

In addition, in the prior art, the molding 41 is made from an insulating material of organic resin with a high specific resistance of $1\times10^{17}$ $\Omega$cm or greater, therefore, at time of assembling using surface mount technology (SMT), static electricity accumulates on the surface of this insulated molding material through the contact with a jig surface or during storage. When this organic resin is thick, the electric field strength in the mold is relatively small, and the electrostatic discharge damage of the electronic parts does not often occur. However, when the thickness of the molding material is 1.5 mm or less, the strength of the electric field of the static electricity becomes relatively large, and, it can not be ignored from the aspect of guaranteeing the reliability of the electronic parts.

SUMMARY OF THE INVENTION

An object of the present invention is to provide, with due consideration to the drawbacks of such conventional devices, an electronic device in which the decrease in reliability is prevented.

Another object of the present invention is to provide a reliable device wherein an electronic device such as a semiconductor device or the like is wirebonded and molding is applied over the entire body of the electronic device.

Another object of the present invention is to use a non-product gas (a gas which does not decompose to form a film of a solid reaction product) for the plasma process to provide a densified layer, so that the surface of the molding modified into the densified layer, or a densified layer is formed on the surface of the molding.

Another object of the present invention is to prevent the development of cracking and swelling by improving the adherence of the die to the molding or protective film which adhere to the die.

Another object of the present invention is to provide a molding process which is carried out on the entire body of the device has been wirebonded, so that the molding operation provides a densified layer on the surface in order to prevent entry of moisture from external sources into this molding.

In the present invention, there is no protective film formation (final coating) at the wafer level to prevent deterioration caused by water permeating the molding, but instead after the molding process (molding process by an organic resin), this film is provided on the outside of the electronic parts, by a plasma process using inert gas such as argon or a fluorinated gas over the molding after the molding process, or by using silicon nitride, "Diamond-Like Carbon" (DLC, referred to as so because it is carbon with the same sp3 bond as a diamond), or the like over the molding after the molding process.

These objects are achieved in the present invention by the provision of a densified layer after completion of the molding process, which prevents the permeation of moisture into the moldings.

Used as the means for providing this densified layer in the present invention are a method of plasma-hardening the organic resin molding in the vicinity of the surface by means of an argon or the like plasma process conducted on the entire body of the device, and plasma CVD (chemical vapor deposition) process by which the coating of a silicon nitride film or a DLC film acting as a protective film is formed to prevent moisture permeation into this surface.

In the present invention, an even more reliable electronic device can be fabricated using a plasma process, by covering the entire lead frame and chip with silicon nitride, before forming the molding.

Still another object of the present invention is to provide, with due consideration to the drawbacks of the conventional DIPs (dual in-line packages), an electronic device in which a decrease in reliability from a localized breakdown in the electronic parts because of static electricity and the occurrence of cracks is prevented.

Another object of the present invention is to provide a manufacturing method for forming, on the surface of the molding, a carbonaceous film of carbon or of a substance including carbon as the main ingredient in order to prevent the breakdown of the inner sections of the electronic parts, and to prevent the permeation of external moisture into the interior of the molding material.

These objects are achieved in the present invention by the provision of a carbonaceous film of carbon or of a substance including carbon as the main ingredient, formed on the surface of the molding after completion of the molding process.

For these purposes, the present invention uses a CVD method, utilizing a carbon compound gas, in the application of a film of carbon, or of a material of which carbon is the main ingredient, which has good heat transfer capabilities and which has superior adhesion to the organic resin molding (referred to as DLC).

In the present invention, a carbonaceous film of carbon or of a substance including carbon as the main ingredient, which has good adherence to the organic resin, is formed to a thickness of 0.05 to 5 µm, or preferably of a thickness of 0.1 to 1 µm. In order to form this film, a vacuum is first applied to the electronic device covered with molding to draw off the moisture in the molding material. The surface then has weak insulating characteristics as a countermeasure against static electricity. To prevent permeation of water from the exterior, the carbonaceous film (DLC film) is formed as a protective film, using the vacuum along with the plasma CVD method for forming a coating from the sputtering effect. The carbonaceous film applied onto the surface of the molding has a specific electric resistance between $1 \times 10^6$ and $5 \times 10^{13}$ Ωcm.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 2A:
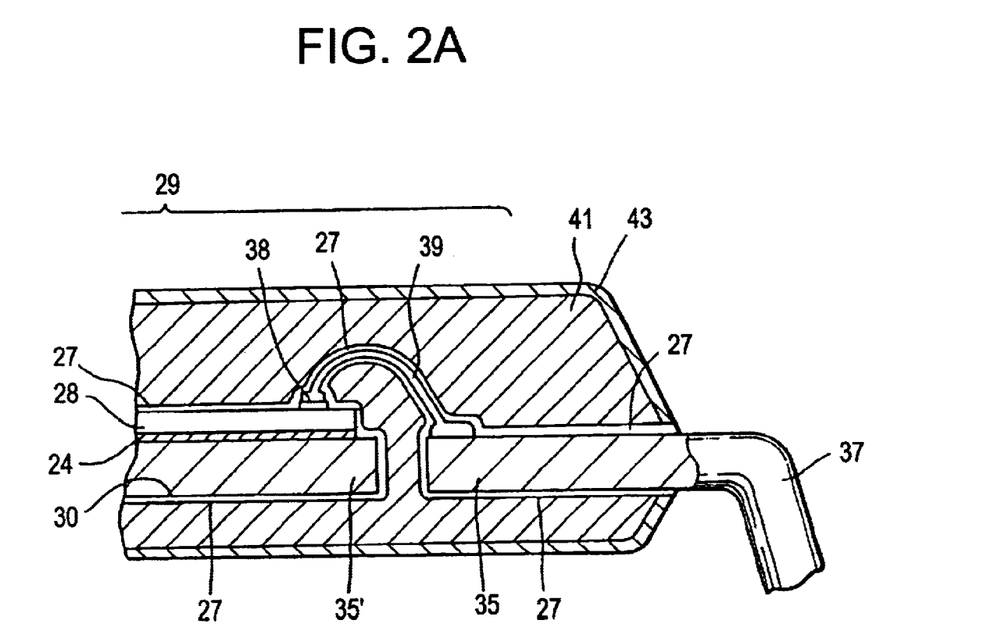
FIG. 2(A) and FIG. 2(B) are a vertical cross-sectional view showing the essential elements of a plastic package semiconductor device of the present invention after a moisture resistance test and solder test have been performed.
Figure 2B:
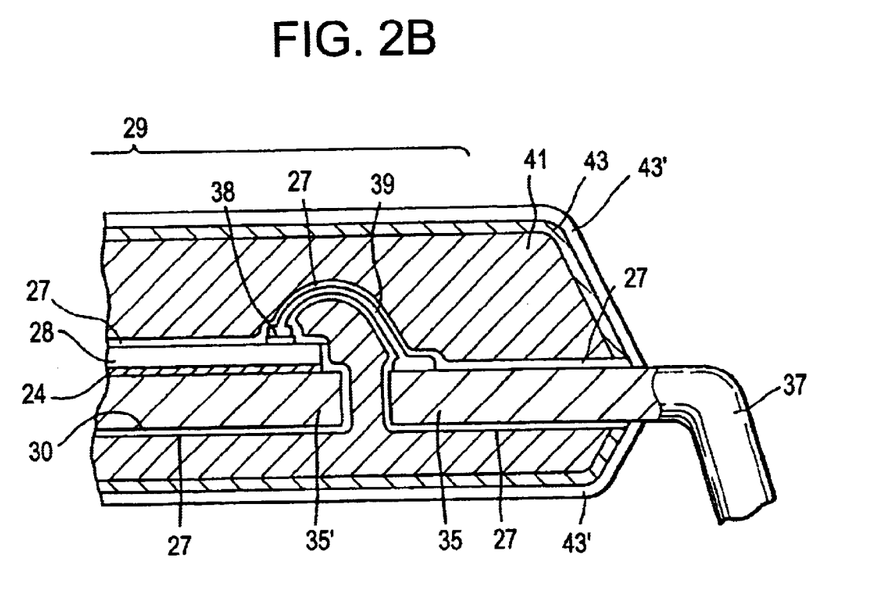

FIG. 2(A) and FIG. 2(B) show a vertical cross-sectional view of a plastic DIP (Dual In Line Package) or a flat pack according to the configuration of the present invention. In FIGS. 2(A) and 2(B), as well as FIG. 1, reference numeral 29 shows an electronic device.

In the drawing, wire bonding of a gold wire 39 is performed between an electronic device chip 28 attached to a die 35' of a lead frame, specifically an aluminum pad 38 of the chip 28, and metal stems 35 of the lead. The chip 28 is attached to the die 35' by a silver paste 24 of an organic type of silver paste or a glass type of silver paste, or a gold-silver alloying instead of the silver paste.

Further, to provide high reliability, the suboxides and natural oxides developed in the surface of the chip 28, the surface of the pad 38, the surface of the wire 39, and the rear or under surface of the die 35', are eliminated by means of a non-product gas plasma process, so that the metal surface 30 is exposed, and a protective film for preventing deterioration, in particular a silicon nitride film 27, is applied by the plasma vacuum method on this metal surface.

In such a manner, a protective film for preventing deterioration, such as a silicon nitride film, is formed to a thickness of 300 to 5000 Å, generally about 1000 Å, after which an organic resin, for example, an epoxy resin (say, 410B) is injected using a commonly known injection molding method, so that the unit is sealed. Typical organic resin which may be used are epoxy resins such as novolak-type resins (which are divided into phenol and cresol resins), bisphenol A type resins, and aliphatic cyclic resins; silicon resins; and PPS (Poly Phenylene Sulfide) resins. These resins together with the other organic resins used to package IC chips and the like are characterized by pores in the surface thereof which may lead to problems which, as described hereinafter, are addressed by the present invention. In addition, the lead is bent at a lead section 37, and the tie bar is cut. Also, the lead section is acid washed, after which a solder coating is applied to the lead.

When this has been completed, in a first feature of the present invention, a densified layer 43 is formed over all the front and rear surfaces of the molding 41 of the present invention to prevent water permeation.

Since organic gases, chlorine, and moisture, which reduce reliability, are present throughout the molding 41 when the molding 41 is formed, in order to eliminate these, first a vacuum is drawn and they are all exhausted to the outside, then a plasma process is applied to the surface.

In the plasma process method of the present invention, inactive gases such as argon, neon, helium, krypton, and the like or nitrogen fluorides, carbon fluorides, and nitrogen may be used. Argon is preferable in experiments because it has a large mass, and is produced at lower cost and easily turned into plasma. The plasma process is carried out using a plasma process apparatus such as the apparatus shown in FIG. 3(A) (later explained). In this manner, the densified layer 43 is formed. Next, a DLC film or a silicon nitride film of 0.1 to 1 µm thickness is formed by a plasma CVD process as a protective film 43' over the entire body.

The protective film, such as a silicon nitride film, is formed by introducing a silicon compound gas and ammonia or nitrogen into a plasma reaction chamber at room temperature, and supplying electrical energy, which is known as the plasma chemical vapor method. A DLC film is formed as a protective film at room temperature by the plasma CVD method using ethylene. It is effective to mix nitrogen fluoride into this DLC film to adjust the thermal expansion.

In a second feature of the present invention, after a solder coating is applied to the lead section acid-washed as mentioned before, on the entire front surface and underside of the insulated organic resin molding 41 which has a specific resistance of $10^{17}$ Ωcm, a DLC film 43 with a specific resistance of $1\times10^6$ to $5\times10^{13}$ Ωcm is formed to a thickness of 0.05 to 5 μm. Since reliability-reducing organic gases, chlorine, and moisture exist throughout the molding 41, these are removed by first applying a vacuum to the complete system and exhausting these materials to the outside. The DLC film is then formed on the surface using the plasma CVD method.

Figure 3A:
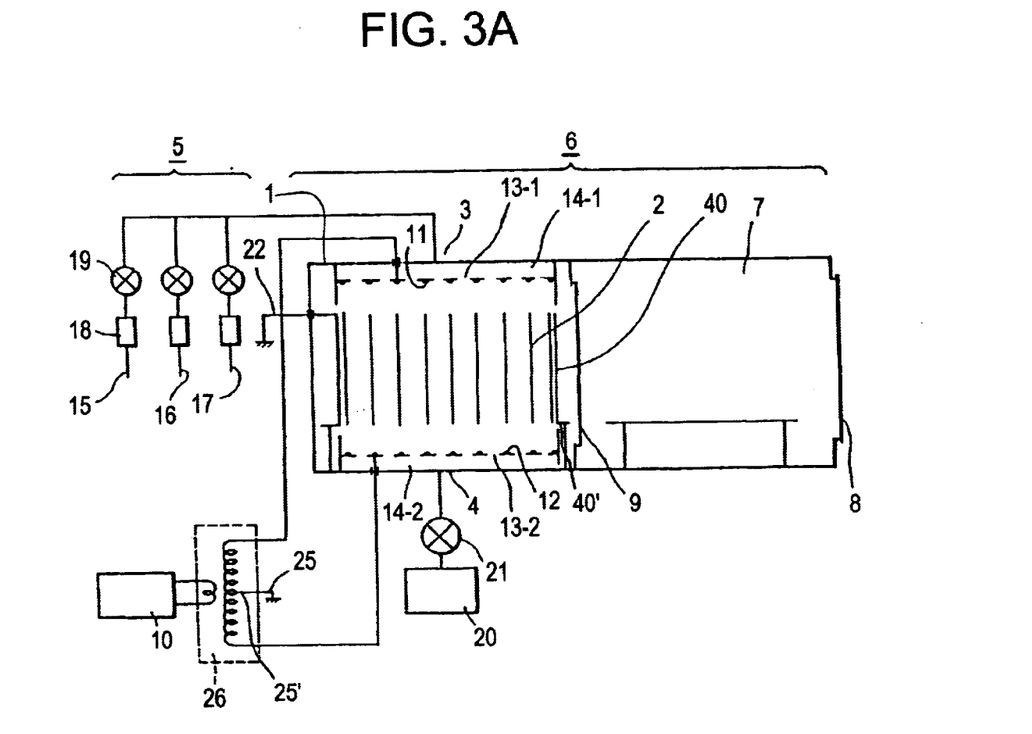
FIG. 3(A) to FIG. 3(B) are a schematic illustration of a plasma phase reaction apparatus for implementing the method of the present invention.
Figure 3B:
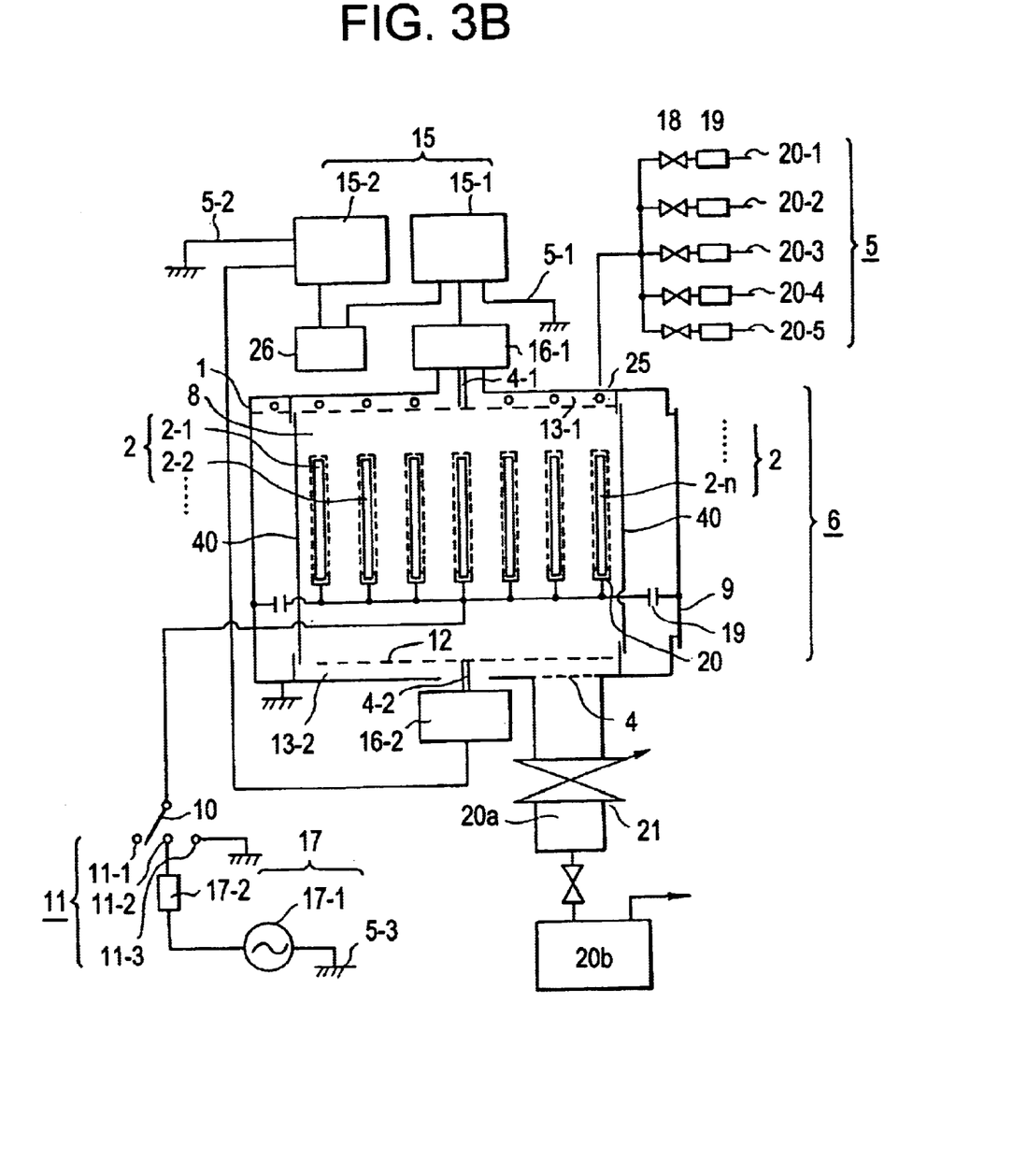

The plasma process method of the present invention utilizes the plasma process method shown in FIG. 3(B). The surface is sputtered by inert gas such as argon, neon, helium, krypton, or the like, or nitrogen and then activated. A DLC film is then formed as a protective film 43' to a thickness of 0.05 to 5 μm, and preferably 0.1 to 1 μm, using the plasma CVD method.

To form a protective film such as the DLC film, at room temperature or close to room temperature (without actively providing external heating, but at a temperature in the range provided by self-heating from the plasma sputtering), mixed gases of hydrogen and carbon-fluoride compounds (materials which have C-F bond, such as $C_2F_6$, $C_3F_8$, $CHF_3$, $CH_2F_2$, and the like), or gases of these carbon-fluoride compounds and ethylene ($C_2H_4$), mixed in ratio of 1:4 to 4:1, for example, 1:1, are introduced into the plasma reaction chamber and the film is formed by the plasma vapor reaction method in which electrical energy is supplied to the chamber. To control the specific resistance of the DLC film, a method by which hydrides of carbon such as ethylene and the like are added together with trivalent or pentavalent impurities, such as $B_2H_6$, $B(CH_3)_3$, $BF_3$, $NH_3$, $NF_3$, $N(CH_3)_3$, $N(C_2H_2)_3$, $PH_3$, $P(CH_3)_3$ and the like, or a method which varies the position of a DC bias, are effective. These methods can also be used to adjust the thermal expansion between this film and the underlying molding material.

FIG. 3(A) and FIG. 3(B) shows an outline of an apparatus for a plasma process method to conduct a plasma hardening or surface activating in an organic molding with a coating of the silicon nitride film or the DLC film, on a plurality of substrates or base plates 2. The base plate is of a flat pack configuration which is coated with the molding after the chip of the present invention is bonded to the frame, and a plurality of the base plates are gathered together (in the outline below, the base plate and the substrate are together referred to as the substrate).

FIG. 3(A) shows an apparatus for plasma-hardening the resin mold or forming a protective film such as silicon nitride film or a DLC film on the surface of the Bold of the electronic device.

The apparatus in FIG. 3(A) comprises a gas feeding system 5 and a reaction system 6. The reaction system 6 comprises a reaction chamber 1, a preparation chamber 7, and a pair of gate valves 8 and 9. A hood 13-1 is provided in the inside of the reaction chamber 1, and a reactive gas is introduced from the inlet 3 by means of nozzles 14-1. After the reaction has occurred, the waste gas passes through a nozzle 14-2 of a hood 13-2 through a discharge port 4 to a valve 21, and reach a vacuum pump 20.

An electrical energy of 1–500 MHz, e.g. 13.56 MHz is applied to a pair of upper and lower screen-shaped electrodes 11 and 12 of the same size, passing through a matching transformer 26.

In addition, a midpoint 25' of the matching transformer 26 is grounded at 25. Also, a frame-structured holder 40 on the periphery is grounded at 22 when it is conductor and may also be made from an insulating material. Film-forming bodies 2 (hereinafter referred to as the substrates 2) are placed parallel to the direction of the electric field between the pair of electrodes 11, 12 in the frame structured holder 40 positioned on a supporters 40', and also spaced from both the electrodes 11, 12. And the substrates 2 are positioned at a uniform spacing (2–13 cm, e.g. 6 cm) or at an almost uniform spacing. The inside of the holder is 60×60 cm and the distance between electrodes 11 and 12 is 30 cm, effectively 20 cm.

The substrates 2 are positioned in a positive column in a plasma produced by glow discharge.

FIG. 3(B) shows a reaction system 6 and a gas feeding system 5 to form the device mentioned above.

The reaction system 6 comprises a reaction chamber 1, and a gate valves 9. A hood 13-1 is provided inside the reaction chamber 1, and a reactive gas is introduced into the reaction chamber 1 from the inlet [3] by means of a nozzle 25 in the hood 13-1, so that a plasma reaction occurs in a space 8, whereby the base plates or substrates 2 are vacuum-dried, the surface of the molding is activated, and a protective film is formed. After the plasma process or the reaction has occurred, the waste passes through a discharge port 4 to a valve 21, and reaches a turbo molecule pump 20a and a vacuum pump 20b.

Electrical energy from a pair of high frequency power sources 15 (15-1, 15-2), passes through a pair of matching boxes 16-1, 16-2, and a high frequency of 1 to 500 MHz, for example, 13.56 MHz, passes through a pair of passes 4-1, 4-2 and is applied to a pair of screen-shaped electrodes 11, 12 of the same size, positioned alternately up and down. The phase angle between the high frequency powers from the respective electrodes is 0° C.±30° C. or 180° C.±30° C., controlled by a phase adjuster 26. Also, a frame-structured holder 40 in the case of a conductor is grounded and may also be an insulating material. The reactive gases are excited by the high frequency energy supplied from the electrodes 11, 12. In the plasma process and the plasma CVD method, a plurality of film-forming bodies 2 (2-1, 2-2, - - - 2-n) (hereinafter referred to as the substrates 2) are provided between a pair of electrodes in the frame-structured holder 40 positioned on a supporter 20, in a direction parallel to the electric field of the pair of electrodes 11, 12, and also separated by a condenser 19 from both the electrodes 11, 12 and the reaction chamber 1. The plurality of substrates 2 are positioned at a uniform spacing (2 to 13 cm, for example, 6 cm) or at an almost uniform spacing.

A bias 17 i.e. an AC bias 17-1 of a frequency of 50–100 kHz and a DC bias 17-2 of −50 to −2000 V, is applied to the substrates 2 by turning a switch 10 to a terminal 11-2. This bias is extremely important in forming a hard DLC film of a specific resistance from $1\times10^6$ to $5\times10^{13}$ Ωcm.

The other terminals 5-1, 5-2 and 5-3 of the power supplies are grounded.

Figure 4A:
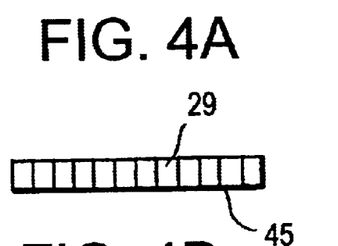
FIG. 4(A) to FIG. 4(C) are an enlarged view of the substrate section inside the apparatus of FIG. 3(A) to FIG. 3(B).
Figure 4B:
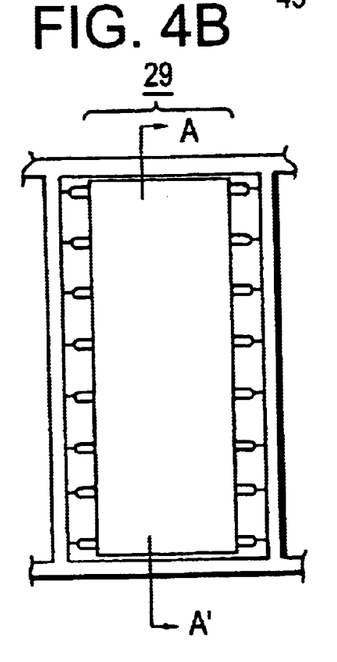
Figure 4C:
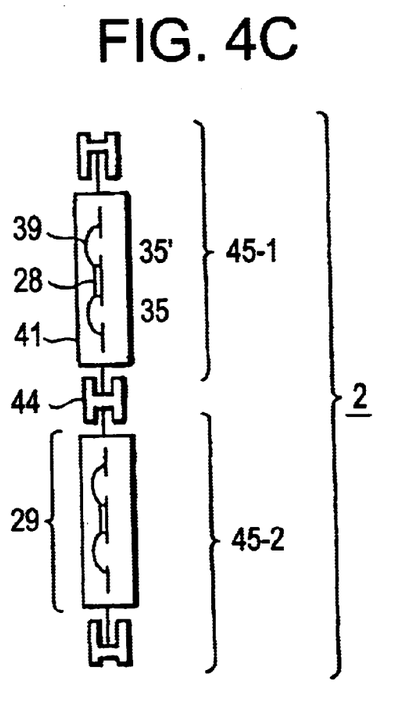

The essential parts of the substrate 2 are shown in FIGS. 4(A) to 4(C).

In FIG. 4(A), a lead frame 45 comprises 5 to 25 electronic devices 29. Each electronic device 29 is molded after an electronic chip e.g. a semiconductor chip is bonded on a die of a lead frame. FIG. 4(B) shows one of the electronic devices provided on the frame 45.

A vertical cross sectional view, viewed along the section A–A' in FIG. 4(B), is shown in FIG. 4(C) as indicated by the reference numeral 29. In FIG. 4(C), a plurality of frames 45-1, 45-2 . . . up to anywhere from 5 to 300 is assembled. Each of these frames 45- is unitized to hold 5 to 25 electronic devices comprising a lead frame 35, a die 35', a semiconductor chip 28, a metal wire 39, and a molding 41, and is integrated by a jig 44 to form the substrate 2. The use of the jig 44 is effective to protect the outer joint members so as not to be coated. This substrate 2 is equivalent to the each substrate 2 (2-1, 2-2, - - - 2-n) in FIGS. 3(A) to 3(B). Then, these substrates 2 in any number from 5 to 50 (seven substrates are shown in the drawing) are positioned in a positive column as shown in FIGS. 3(A) to 3(B).

In FIGS. 3(A) and 3(B), the reactive gases are provided with plasma active conditions in the interior enclosed by the frame-structured holder 40, the hood 13-1 and the hood 13-2. The plasma process is applied to the molding and a densified layer is formed. This densified layer forms the protective film on the molding.

In the plasma process method of the present invention as shown in FIG. 3(A), the substrates are maintained in a positive column of argon plasma at room temperature. When performing the plasma process using a non-product gas or forming a DLC film or silicon nitride film using a product gas, a sufficiently densified layer can be produced without heating from external sources.

As shown in FIG. 3(B), the DLC film is formed by the plasma CVD method in the method of the present invention by first maintaining the molding in a positive plasma column of argon at room temperature, eliminating absorbed materials by a non-product vapor plasma process, and activating the surface of the molding resin. When the DLC film is being formed, a sufficiently densified layer can be formed by the application of the bias, even when no external heat is applied.

In the present invention, in addition to the plasma process method and the PCVD method, a photo CVD (or photo FPCVD) method using not only electrical energy but also photoenergy with far infrared radiation at 10–15 μm or ultra violet radiation at 300 nm or less applied simultaneously can be effectively used.

Embodiment No. 1

Now referring to FIG. 3(A), in the plasma process apparatus and CVD apparatus shown, the gas feeding system 5 is supplied with disilane ($Si_2H_6$), through a line 17, ammonia, or nitrogen through a line 16, and argon 15, which is a non-product gas for the plasma process, through a line 15. These flows are controlled by a flowmeter 18 and a valves 19.

For example, the substrates 2 were maintained at room temperature (which includes self-heating as a result of the plasma), with heating from outside not being particularly actively carried out. Then, first, the substrates after molded, are placed in the reaction chamber 1. A vacuum of $1\times10^{-3}$ Torr or less is drawn over the entire system for 10 to 30 minutes, so that the organic gases, chlorine, and moisture are removed from throughout the molding. After that, argon is introduced and the plasma process is carried out on the substrate 2, in particular on the surface of the molding 41. Specifically, the argon gas plasma is obtained by applying an output of 1 kW at a frequency of 13.56 MHz for 10 to 30 minutes to the electrodes 11, 12.

When this is completed, the densified layer 43 as shown in FIG. 2(A) is created on the surface of the molding. In this regard, it should be noted that pores which exist in the plastic package at its surface are filled with an inactive gas such as the above-mentioned argon or the other inactive gas mentioned hereinbefore. That is, the pores are filled because of the foregoing plasma treatment so that it is possible to prevent impurities from entering into the inside of the package through the pores. As a result, the reliability of the package can be improved as compared with conventional plastic packages.

To investigate the industrial effectiveness of an electronic device with this densified layer, the device was allowed to stand for 24 hours in an atmosphere of 85° C. and 85% (relative humidity, RH) and then soldered at 260° C. and for 5 Sec. As a result, on 50 samples tested, there was absolutely no sign of cracks or swelling. However, when a sample was stored under 85° C./85% RH conditions for 1000 hours and soldered, 10 out of 50 samples were unsatisfactory. Of course, when reliability tests were carried out on electronic devices without the densified layer of the present invention, all 50 of 50 samples were unsatisfactory.

Embodiment No. 2

In this embodiment, an additional protective layer 43' shown in FIG. 2(B) wasformed on a substrate subjected to the same plasma process as in Embodiment No. 1. A silicon nitride film 43' was formed on a film-forming surface after the plasma process of Embodiment No. 1. The reactive gases used were $NH_3/Si_2H_6/N_2$ in the ratio of 1/3/5. The electric energy was applied to these gases at an output of 1 kW at a frequency of 13.56 MHz for 10 to 30 minutes through the electrodes 11, 12. In this way a film was formed in about 30 minutes to an average thickness of 5000 Å±200 Å) at an average velocity of 3 Å/sec.

The silicon nitride film had a dielectric strength of $8\times10^6$ V/cm or greater and the specific resistance was $2\times10^{15}$ Ωcm. The infrared absorption spectrum showed an Si-N bond absorption peak of 864 $cm^{-1}$, and the refractive index was 2.0.

The electronic device manufactured in this manner was stored under 85° C. for 5 sec. There was absolutely no formation of cracks or swelling observed in this molding.

Embodiment No. 3

Now referring to FIG. 3(B), in the plasma CVD device shown, the gas feeding system 5 supplies a carbon fluoride, $C_2F_6$ or $C_3F_8$ through a line 20-1, a nitride gas, $N(CH_3)_3$ through a line 20-3, ethylene through a line 20-2, hydrogen or argon, which is a non-product gas for the plasma process, through a line 20-15. These flows are controlled by a flowmeter 19 and a valve 18.

For example, the substrates 2 were maintained at room temperature (which includes self-heating as a result of the plasma), with heating from outside not being particularly actively carried out. Then, first, the substrate after molded, is placed in the reaction chamber 1. A vacuum of $1\times10^{-3}$ Torr or less is drawn over the entire system for 10 to 30 minutes, so that the organic gases, chlorine, and moisture are removed from throughout the molding.

Then argon is introduced and an output of 1 kW at a frequency of 13.56 MHz is supplied to the pair of electrodes 11, 12 for 10 to 30 min to convert the argon to the plasma form, so that the plasma process is carried out particularly on the surface of the molding 41 on the substrates 2. By this process, the impurities and contaminants on the surface of the molding are sputtered and the surface of the molding is activated and densified.

A protective film of DLC is formed on the substrate which has been subjected to the plasma process. When DLC is formed on a film-forming surface which has undergone a plasma process such as that mentioned above, reactive gases such as, for example, $C_2H_4/C_2F_6/H_2=1/1/5$ are used. And, an output of 1 kW at a frequency of 13.56 MHz is supplied to the pair of electrodes 11, 12 for these gases. At this time, $B(CH_3)_3$ or $N(CH_3)_3$ is added in the ratio $B(CH_3)_3$ or $N(CH_3)_3/(C_2H_4+C_2F_6)=0.0013–0.03$. In this way, a film is formed in about 30 min to an average thickness of 5000 Å (5000 Å±200 Å) (an average velocity of 3 Å/sec).

By subjecting the film-forming surface to a large AC bias of 50 kHz with the voltage ±300 V and a DC bias voltage of −50 to −2000 V, the specific resistance of the DLC film can be controlled to a range from $1\times10^6$ to $5\times10^{13}$ Ωcm. Also, by the addition of $NH_3$, $B(CH_3)_3$ and the like, it is possible to obtain a film which strongly adheres to the substrate and has a Vickers hardness of 500 to 3000 kg/mm$^2$, which is greater than the 200 to 400 kg/mm$^2$ of the molding material.

The electronic device obtained in this manner was tested for static electricity resistant characteristics using the static electricity breakdown test machine ESS-6235 of the Noise Research Laboratory. A C/MOS 256 k DRAM memory IC was coated to a thickness of 1.4 mm with an organic resin molding material. A DLC film with a thickness of 0.5 μm and specific resistance of $10^9$ to $10^{11}$ Ωcm was applied. An output voltage of 20 kv was applied to the DLC 900 times in succession. Twenty samples were tested. No static electricity breakdown was observed in any of these samples.

On the other hand, twenty samples were prepared of an electronic device prepared in the same manner but without the formation of the DLC film of the present invention. These samples were tested under the same conditions. All samples showed breakdown at the input pin and the like.

The electronic device manufactured by the method of the present invention in this manner was stored under 85° C./85% RH conditions for 1000 hours and soldered at 260° C. for 5 sec. There was absolutely no formation of cracks or swelling observed in the molding of any of the 20 samples tested. As might be expected, all samples prepared without the formation of the DLC film of the present invention exhibited defects as shown in FIG. 1.

In summary, when a plasma process only is applied to the molding by the use of the non-product gas, no waste materials adhere to the lead frame, and because the inside of the reaction chamber maintains a normal degree of cleanliness, this method has superior mass production characteristics. However, this method is not adequate for providing ultrahigh reliability. On the other hand, when a blocking film is formed on the molding to give a densified film, ultrahigh reliability is obtained. However, when the film is being formed, it is necessary to make a jig to prevent a coating on the lead, and also, after CVD, the inside of the plasma device has to be cleaned.

In the present invention, electric power and time for heating are not necessary, so productivity is superior. In addition, when the plasma process is being carried out, because impure gases and moisture in the molding are removed by the vacuum deaeration process, drawbacks due to moisture within the organic resin are eliminated. Otherwise, such moisture would cause reactions with chlorine and the metal in the dies, so that low-grade oxides are produced, thus decreasing reliability.

In the present invention, when a semiconductor is mounted on the PCB of the electronic device, e.g. on the PCB of the electronic device using SMT, swelling caused by heating the molding material as shown by the conventional examples, can be prevented.

The protective film in the present invention was a silicon nitride film or a DLC film. However, this could be a single or multilayer of a silicon oxide film, or any other insulating film.

Because silicon oxide is essentially hydroscopic it cannot be expected to provide the same long-term, moisture resistant reliability as silicon nitride and DLC.

Also, in the present invention, the electronic device chip part was described as a semiconductor chip, but this could just as easily be a resistor, condenser, or the like. The type of bonding used does not only have to be wire bonding, but flip chip bonding, solder bump bonding, or the like also be used.

In the present invention, there are also cases where the chip is large and the molding is applied without the use of a die. However, in such a case it is also effective to completely cover a lead frame for use as a substrate and the chip thereon with a protective film.

The foregoing explanation was given for the case where as semiconductor chip was embedded in the lead frame, but the present invention is not particularly restricted to being applied on a metal lead frame. In such a hybrid IC, thick film IC or the like, where an active element or a passive element is mounted on a base plate or substrate of which the entirety is subjected to the molding process, the same effect can be expected.

In addition, in the case where a DLC film of a specific resistance of $1\times10^6$ to $5\times10^{13}$ Ωcm was produced in the form of a densified film on the molding as a blocking film, even when mounted by SMT, an extremely high degree of slip was obtained. This tendency was particularly evident in the case where a DLC film containing fluorine was formed. For this reason, the present invention is effective where automatic assembly is used.

Furthermore, even when 20 kV of quasi-static electricity was applied there was no damage or breakdown in the electronic device of the present invention. This is a great advantage over the case where no protective film is formed, so that failures are produced in all of the twenty specimen. Accordingly, it should be understood that the coating on the sealing molding is very effective for the electronic device.

What is claimed is:

1. An electronic device comprising a package comprising an organic resin, wherein an outer surface of said package is provided with a protective film comprising a diamond-like carbon doped with an element selected from the group consisting of phosphorus, fluorine, boron and nitrogen and a densified layer is formed between the protective film and said package, said densified layer comprising said organic resin and an inert element selected from the group consisting of argon, neon, helium, and krypton.

2. The electronic device according to claim 1 wherein a thickness of said protective film is 0.01 to 1 μm.

3. The electronic device according to claim 1 wherein a specific resistance of said protective film is within a range of $1\times10^6$ to $5\times10^{13}$ Ωcm.

4. An electronic device comprising an electronic member and a package comprising an organic resin which covers at least a portion of said electronic member, wherein a protective film comprising diamond-like carbon is formed on said package, and a densified layer is formed between the protective film and said package, said densified layer comprising said organic resin and an inert element selected from the group consisting of argon, neon, helium, and krypton.

5. The electronic device according to claim 4 wherein a thickness of said protective film is 0.01 to 1 μm.

6. The electronic device according to claim 4 wherein a specific resistance of said protective film is within a range of $1\times10^6$ to $5\times10^{13}$ Ωcm.

7. An electronic device comprising a package comprising an organic resin, wherein an outer surface of said package is provided with a protective film having a thickness of 0.005 to 5 μm, said protective film comprising diamond-like carbon doped with an element selected from the group consisting of phosphorus, fluorine, boron and nitrogen, and a densified layer is formed between the protective film and said package, said densified layer comprising said organic resin and an inert element selected from the group consisting of argon, neon, helium, and krypton.

8. The electronic device according to claim 7 wherein a thickness of said protective film is 0.01 to 1 μm.

9. The electronic device according to claim 7 wherein a specific resistance of said protective film is within a range of $1 \times 10^6 \times 5 \times 10^{13}$ Ωcm.

10. An electronic device comprising an electronic member and a package comprising an organic resin which covers at least a portion of said electronic member, wherein a protective film is formed on said package, with a thickness of 0.005 to 5 μm, and a densified layer is formed between the protective film and said package, said densified layer comprising said organic resin and an inert element selected from the group consisting of argon, neon, helium, and krypton.

11. The electronic device according to claim 10 wherein a thickness of said protective film is 0.01 to 1 μm.

12. The electronic device according claim 10 wherein a specific resistance of said protective film is within a range of $1 \times 10^6$ to $5 \times 10^{13}$ Ωcm.

13. An electronic device comprising an electronic member and an organic resin covering at least a part of said electronic member, wherein a protective film is formed on said organic resin, and said organic resin has a region in contact with said protective film and said region contains an inert element selected from the group consisting of argon, neon, helium, and krypton.

14. The electronic device according to claim 13 wherein said protective film has a thickness of 0.005 to 5 μm.

15. The electronic device according to claim 13 wherein a specific resistance of said protective film is within a range of $1 \times 10^6$ to $5 \times 10^{13}$ Ωcm.

16. The electronic device according to claim 13 wherein said organic resin comprises an epoxy resin.

17. An electronic device comprising an electronic member and an organic resin covering at least a part of said electronic member, wherein a protective film is formed on said organic resin, said protective film comprising diamond-like carbon doped with nitrogen, and said organic resin has a region in contact with said protective film and said region contains an inert element selected from the group consisting of argon, neon, helium, and krypton.

18. The electronic device according to claim 17 wherein said protective film has a thickness of 0.005 to 5 μm.

19. The electronic device according to claim 17 wherein a specific resistance of said protective film is within a range of $1 \times 10^6$ to $5 \times 10^{13}$ Ωcm.

20. The electronic device according to claim 17 wherein said organic resin comprises an epoxy resin.

21. An electronic device comprising a package comprising an organic resin, wherein a surface of said package is provided with a carbonaceous protective film having sp3 bonds, said carbonaceous protective film containing an element selected from the group consisting of phosphorus, fluorine, boron and nitrogen, and said organic resin has a region in contact with said protective film and said region contains an inert element selected from the group consisting of argon, neon, helium, and krypton.

22. An electronic device comprising an electronic member and a package comprising an organic resin which covers at least a portion of said electronic member, wherein a carbonaceous protective film having sp3 bonds is formed on said package, said carbonaceous protective film containing an element selected from the group consisting of phosphorus, fluorine, boron and nitrogen, and said organic resin has a region in contact with said protective film and said region contains an inert element selected from the group consisting of argon, neon, helium, and krypton.

23. An electronic device comprising an electronic member and an organic resin covering at least a part of said electronic member, wherein a carbonaceous protective film having sp3 bonds is formed on said organic resin, said carbonaceous protective film containing an element selected from the group consisting of phosphorus, fluorine, boron and nitrogen, and said organic resin has a region in contact with said protective film and said region contains an inert element selected from the group consisting of argon, neon, helium, and krypton.

24. The electronic device according to claim 23 wherein said carbonaceous protective film has a thickness of 0.005 to 5 μm.

25. The electronic device according to claim 23 wherein a specific resistance of said carbonaceous protective film is within a range of $1 \times 10^6$ to $5 \times 10^{13}$ Ωcm.

26. The electronic device according to claim 25 wherein said organic resin comprises an epoxy resin.

27. An electronic device comprising an electronic member, an organic resin covering at least a part of said electronic member, a carbonaceous protective film having sp3 bonds formed on said organic resin, wherein said carbonaceous protective film contains nitrogen, and said organic resin has a region in contact with said protective film and said region contains an inert element selected from the group consisting of argon, neon, helium, and krypton.

28. The electronic device according to claim 27 wherein said carbonaceous protective film has a thickness of 0.005 to 5 μm.

29. The electronic device according to claim 27 wherein a specific resistance of said protective carbonaceous film is within a range of $1 \times 10^6$ to $5 \times 10^{13}$ Ωcm.

30. The electronic device according to claim 27 wherein said organic resin comprises an epoxy resin.

* * * * *